United States Patent
Ki et al.

(10) Patent No.: US 10,715,177 B2
(45) Date of Patent: Jul. 14, 2020

(54) LOSSY COMPRESSION DRIVE

(71) Applicant: Samsung Electronics Co., Ltd., Suwon-si, Gyeonggi-do (KR)

(72) Inventors: Yang Seok Ki, Palo Alto, CA (US); Yongsuk Lee, Cupertino, CA (US); Jason Martineau, Milpitas, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/728,261

(22) Filed: Oct. 9, 2017

(65) Prior Publication Data
US 2018/0367161 A1  Dec. 20, 2018

Related U.S. Application Data (60) Provisional application No. 62/542,008, filed on Aug. 7, 2017, provisional application No. 62/522,423, filed on Jun. 20, 2017.

(51) Int. Cl.
*G06F 3/06* (2006.01)
*H03M 7/30* (2006.01)

(52) U.S. Cl.
CPC .......... *H03M 7/6088* (2013.01); *G06F 3/064* (2013.01); *G06F 3/0608* (2013.01); *G06F 3/0638* (2013.01); *G06F 3/0673* (2013.01); *H03M 7/3059* (2013.01)

(58) Field of Classification Search
CPC .. H03M 7/6088; G06F 3/0608; G06F 3/0673; G06F 3/064
See application file for complete search history.

(56) References Cited

U.S. PATENT DOCUMENTS 5,463,772 A * 10/1995 Thompson ............ G06F 3/0601
 707/693
5,892,847 A    4/1999 Johnson
8,036,265 B1  10/2011 Reynolds et al.
(Continued)

OTHER PUBLICATIONS

Chye, En Un et al., "Selection Criteria of the Compression Algorithm in Information-Measuring System", 2nd International Conference on Industrial Engineering, Applications and Manufacturing (ICIEAM), Jun. 30, 2016, (4 pages).
(Continued)

*Primary Examiner* — Larry T Mackall
(74) *Attorney, Agent, or Firm* — Lewis Roca Rothgerber Christie LLP (57) ABSTRACT

A method for lossy data compression, the method including receiving raw data at a storage device, receiving a request to compress flag, accessing an onboard data compression algorithm library containing various data compression algorithms respectively corresponding to lossy data compression schemes, selecting one of the data compression algorithms based on a number of parameters, running the selected data compression algorithm either online such that the raw data is compressed by the storage device when it is received, and is then stored on the storage device as compressed data, or offline such that the raw data is stored at the storage device, is later compressed by the storage device according to the selected data compression algorithm, and is resaved at the storage device as compressed data.

17 Claims, 2 Drawing Sheets

(56) References Cited

U.S. PATENT DOCUMENTS

| | | | |
|---|---|---|---|
| 8,345,998 B2 | 1/2013 | Malik et al. | |
| 8,386,444 B2 | 2/2013 | Kraus et al. | |
| 8,427,346 B2 | 4/2013 | Potkonjak | |
| 8,442,818 B2 | 5/2013 | Trainor | |
| 8,549,518 B1* | 10/2013 | Aron | G06F 9/45558 |
| | | | 718/1 |
| 9,118,345 B2 | 8/2015 | Wegener | |
| 9,235,905 B2 | 1/2016 | Ignatchenko et al. | |
| 9,779,023 B1* | 10/2017 | Armangau | G06F 12/0875 |
| 2002/0191692 A1* | 12/2002 | Fallon | H03M 7/30 |
| | | | 375/240 |
| 2004/0249623 A1* | 12/2004 | Selvidge | G06F 17/5027 |
| | | | 703/23 |
| 2005/0210054 A1* | 9/2005 | Harris | G06F 17/30067 |
| 2005/0243610 A1* | 11/2005 | Guha | G06F 1/3203 |
| | | | 365/189.05 |
| 2006/0193470 A1 | 8/2006 | Williams | |
| 2007/0237176 A1* | 10/2007 | Bartlett | H04L 12/2856 |
| | | | 370/468 |
| 2008/0037880 A1 | 2/2008 | Lai | |
| 2012/0030408 A1 | 2/2012 | Flynn et al. | |
| 2013/0191649 A1 | 7/2013 | Muff et al. | |
| 2014/0281146 A1 | 9/2014 | Horn | |
| 2015/0302111 A1 | 10/2015 | Yue et al. | |
| 2016/0099810 A1 | 4/2016 | Li et al. | |

OTHER PUBLICATIONS

Larsson, Anders et al., "SOC Test Optimization with Compression-Technique Selection", IEEE International Test Conference, Santa Clara, CA Jun. 30, 2008, (1 page).

Wu, Chin-Hsien et al.; An Efficient B-Tree Layer for Flash-Memory Storage Systems, Department of Computer Science and Information Engineering, National Taiwan University, Taipei, Taiwan, 2003, 20 pages.

* cited by examiner

LOSSY COMPRESSION DRIVE

CROSS-REFERENCE TO RELATED APPLICATIONS

The present application claims priority to, and the benefit of, U.S. Provisional Patent Application No. 62/542,008 filed on Aug. 7, 2017, and also claims priority to, and the benefit of, U.S. Provisional Patent Application No. 62/522,423 filed on Jun. 20, 2017, and is related to U.S. Nonprovisional patent application Ser. No. 15/688,779 filed on Aug. 28, 2017, which also claims priority to, and the benefit of, the U.S. Provisional Patent Application No. 62/522,423, the contents of all of which are incorporated herein by reference in their entirety.

BACKGROUND

Data compression is a well-known and useful technique to increase the effective use of data storage capacity, such as a hard storage device. However, some data compression schemes or algorithms work better with certain types of data than others. Data compression can either be termed as "lossless" data compression, where the exact original data can be obtained from the compressed version, or as "lossy" data compression, where the exact input data cannot be restored from the compressed version.

Generally data compression occurs at the host, which then sends the compressed data as a compressed data file to the drive (e.g., a hard storage device (HDD), or a solid state drive (SSD)). On-drive data compression, however, is where the drive receives a raw, uncompressed data file from the host, compresses the data, and then stores the compressed data file thereon.

Previous methods of on-drive data compression compress the data "dumbly," or perform unintelligent/oversimplified data compression, where every raw data file that is received by the drive is compressed using an identical data compression method or algorithm. Thereafter, the drive stores the compressed data as a compressed data file thereon. That is, unintelligent on-drive data compression indicates that the drive takes every piece of data received from the host, and compresses every piece of data with a same data compression algorithm, and then stores the compressed data file on the drive.

When using unintelligent data compression, the drive ignores distinguishing characteristics of the data, such as characteristics that may indicate whether the data was already compressed by the host, whether the data was previously encrypted, whether a user of the drive wants the data to be compressed, and to what degree, or according to what parameters, and a variety of other factors. Further, when using unintelligent data compression, the drive ignores the fact that certain types of data are more amenable to be compressed according to one or more particular data compression schemes than other types of data.

Previously implemented versions of "dumb" or unintelligent data compression (e.g., general data compression) have operated on the assumption that a user seeking to save data on the drive does not want a lossy data compression scheme that results in the loss of important data. The previously implemented versions of unintelligent data compression, therefore, have always involved lossless data compression, as opposed to lossy data compression. That is, because lossy data compression may be harmful to particular types of data (e.g., databases, work data files, etc.), and may potentially result in corrupted data, only lossless data compression schemes were previously implemented in order to maintain the integrity of the data.

Furthermore, previously implemented lossy data compression schemes were always performed by the host, and the data was not compressed by the drive. Instead, the drive would simply receive and store the compressed data file that is sent from the host. The host would typically correspond to the central processing unit (CPU)/computer processor of the user seeking to compress and store the data. Unfortunately, the computing operations associated with such lossy data compression generally take a large number of CPU cycles, and also use a corresponding large amount of energy.

The above information is disclosed only for enhancement of understanding of the background of the disclosure, and may therefore contain information that does not constitute prior art.

SUMMARY

Embodiments of the present disclosure provide a drive that is capable of intelligently performing lossy data compression without the aid of a host.

According to one embodiment, there is provided a

A method for lossy data compression, the method including receiving raw data at a storage device, receiving a request to compress flag, accessing an onboard data compression algorithm library containing various data compression algorithms respectively corresponding to lossy data compression schemes, selecting one of the data compression algorithms based on a number of parameters, running the selected data compression algorithm either online such that the raw data is compressed by the storage device when it is received, and is then stored on the storage device as compressed data, or offline such that the raw data is stored at the storage device, is later compressed by the storage device according to the selected data compression algorithm, and is resaved at the storage device as compressed data.

The parameters may be included in an enhanced key of a key-value pair corresponding to the raw data, or in a quality of service (QoS) preferences data file associated with the storage device.

The method may further include prompting a user requesting to compress the raw data to provide the parameters.

The method may further include reading metadata contained in the raw data corresponding an object signature or an object extension, accessing an object signature dictionary on the storage device or an object extension dictionary on the storage device to determine a data type of the raw data based on the object signature or the object extension, respectively, and selecting the data compression algorithm based on the determined data type.

According to another embodiment, there is provided a method of data compression, the method including receiving raw data at a storage device, compressing the raw data according to a lossy data compression scheme, with the storage device, to generate compressed data, and storing the compressed data on the storage device.

The method may further include determining, with the storage device, a data compression scheme for compressing the raw data.

The method may further include establishing a quality of service (QoS) preferences data file containing information regarding compression schemes and parameters, identifying, by the storage device, an object file corresponding to the raw data, and determining the data compression scheme for compressing the raw data according to the information and the object file.

The method may further include reading metadata of a key of a kay-value pair corresponding to the raw data, selecting a data compression algorithm from a data compression algorithm library on the storage device according to the metadata, and performing the data compression scheme for compressing the raw data in accordance with the selected data compression algorithm.

The raw data may include an object signature or an object extension, the method further including accessing an object signature dictionary on the storage device or an object extension dictionary on the storage device to determine a data type of the raw data based on the object signature or the object extension, respectively, and performing the data compression scheme based on the determined data type.

The method may further include sending the raw data from a host computer to the storage device in accordance with a user request.

The method may further include providing a menu to prompt the user to provide information, and determining a data compression algorithm for compressing the raw data according to the user-provided information.

The method may further include storing the raw data on the storage device, estimating available time or resources corresponding to the storage device, and compressing the raw data upon determining that sufficient time and resources are available.

According to another embodiment, there is provided a data compression system including a host, and a storage device configured to receive raw data from the host, and including a memory, and a processor configured to execute instructions that, when executed by the processor, cause the processor to cause the storage device to compress the raw data according to a lossy data compression scheme to generate compressed data, and cause the storage device store the compressed data on the storage device.

The instructions, when executed by the processor, may further cause the processor to cause the storage device to determine a data compression scheme for compressing the raw data.

The instructions, when executed by the processor, may further cause the processor to cause the storage device to access a quality of service (QoS) preferences data file containing information regarding compression schemes and parameters, identify an object file corresponding to the raw data, and determine the data compression scheme for compressing the raw data according to the information and the object file.

The instructions, when executed by the processor, may further cause the processor to cause the storage device to read metadata of a key of a kay-value pair corresponding to the raw data, select a data compression algorithm from a data compression algorithm library according to the metadata, and perform the data compression scheme for compressing the raw data in accordance with the selected data compression algorithm.

The raw data may include an object signature or an object extension, and the instructions, when executed by the processor, may further cause the processor to cause the storage device to access an object signature dictionary on the storage device or an object extension dictionary on the storage device to determine a data type of the raw data based on the object signature or the object extension, respectively, and perform the data compression scheme based on the determined data type.

The system of claim 13, wherein the instructions, when executed by the processor, further cause the processor to cause the storage device to receive the raw data from a host computer in accordance with a user request.

The instructions, when executed by the processor, may further cause the processor to cause the host to provide a menu to prompt a user, who is requesting the raw data to be compressed, to provide information, and cause the storage device to determine a data compression algorithm for compressing the raw data according to the user-provided information.

The instructions, when executed by the processor, may further cause the processor to cause the storage device to store the raw data on the storage device, estimate available time or resources corresponding to the storage device, and when sufficient time and resources are available, compress the raw data.

The drive according to embodiments disclosed herein is capable of receiving raw data, and performing lossy data compression on the raw data, thereby allowing a user varying levels of control over the specific parameters corresponding to the data compression. Accordingly, the drive is able to free up host CPU cycles by offloading lossy data compression activities, which may otherwise be a relatively substantial load on user systems. In some embodiments, the drive may implement additional or increased hardware resources on the drive, or may implement operating system (OS) level and/or driver level changes.

BRIEF DESCRIPTION OF THE DRAWINGS

Some embodiments can be understood in more detail from the following description taken in conjunction with the accompanying drawings, in which.

DETAILED DESCRIPTION

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

As discussed above, conventionally, unintelligent data compression performed by a hard storage device without the aid of a host was always a form of lossless compression. Furthermore, conventionally, all lossy data compression was performed by the host/host computer/host CPU, and not by the drive. However, there may be scenarios in which different types of data are amenable to a higher degree of compression, where lossy data compression is acceptable or even desirable (e.g., when editing and/or storing a music data file, video data file, or other multi-media data file). Further, there may be situations where it may be useful to compress the raw data file at the drive while freeing up resources that would otherwise be consumed by the host CPU to perform the compression.

Embodiments of the present disclosure provide a storage device, such as a solid state drive (SSD), that is capable of performing lossy data compression and storage without the aid of a corresponding host in the performance of the data compression, thereby freeing up the CPU of the host for other user activities.

Figure 1:
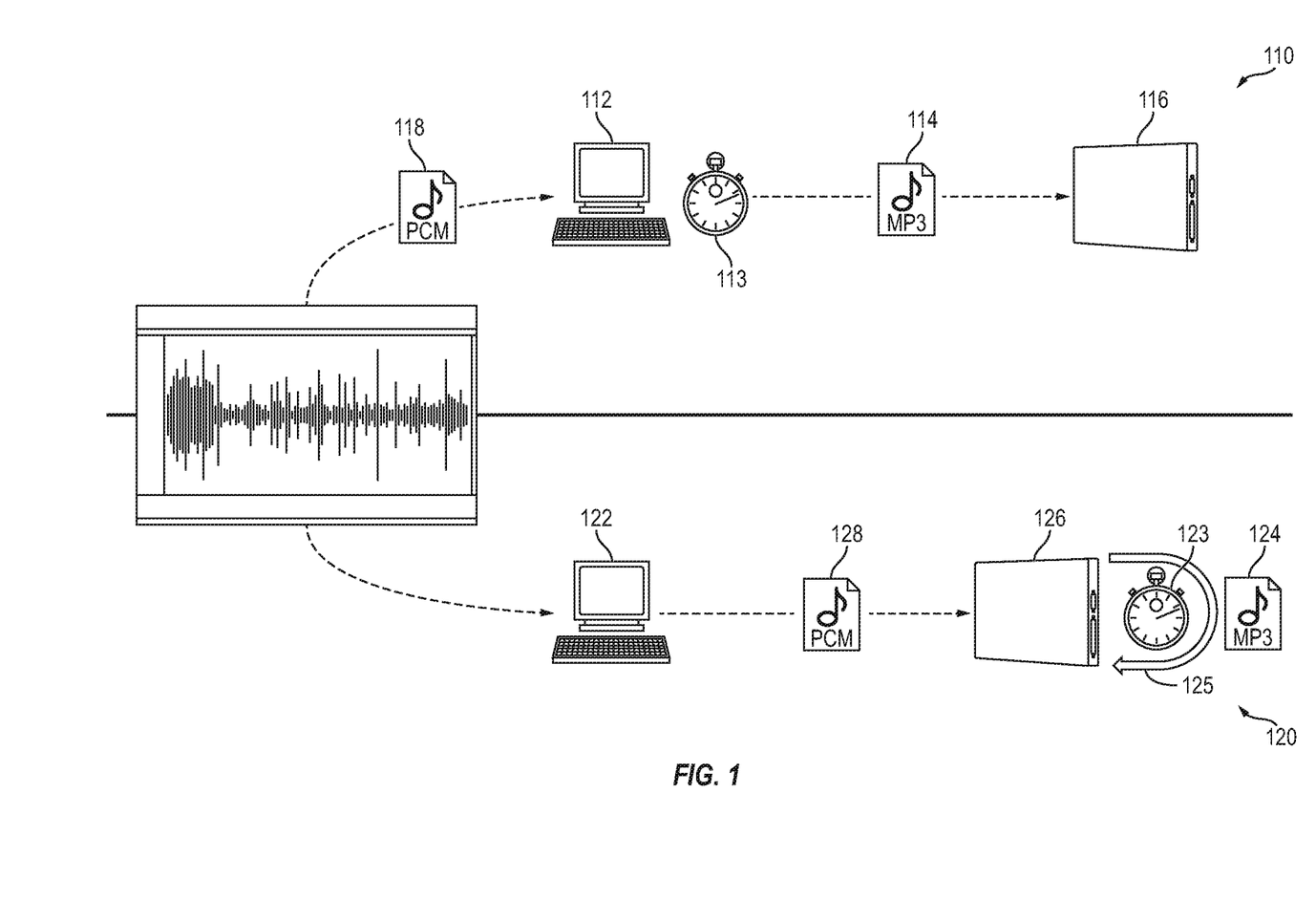
FIG. 1 depicts a comparison of a an example of a conventional method of lossy data compression and an example of a method of lossy data compression according to an embodiment of the present disclosure.

FIG. 1 depicts a comparison of an example of a conventional method of lossy data compression and an example of a method of lossy data compression according to an embodiment of the present disclosure.

Referring to FIG. 1, as previously described, conventional drives 116 have not performed lossy data compression without the aid of the host 112. Instead, as shown in FIG. 1, a lossy data compression scheme 110 was performed by providing the raw data file 118 to the host 112 prior to the host 112 compressing 113 the data, and sending a compressed data file 114 to the drive 116 for storage, thereby depleting system resources of the host 112. That is, conventionally, if a raw data file 118 (e.g., a raw sound/audio data file in PCM format) was going to be compressed, a user would instruct the host 112 to compress 113 the raw data file 118 into a compressed data file 114 (e.g., into an MP3 data file), and the host 112 would then perform the data compression 113 to create the compressed data file 114. Thereafter, the host 112 would send the compressed data file 114 to the drive 116 for storage thereon.

Accordingly, although previous techniques enabled the drive 116 to perform lossless data compression 113 on the raw data 118, which would preserve data fidelity, the drive 116 was incapable of performing lossy data compression. When losses in data fidelity were acceptable and permitted, or requested, by a user (e.g., when a user prefers high volumes of lossy data compression, such as may be the case with music and video editing), lossy data compression would conventionally occupy a great deal of processor cycles on corresponding host machines (e.g., on the host 112).

In view of the above, it may be useful if the task of lossy data compression could be offloaded from the host(s) located in the user's primary CPU(s). Accordingly, a drive 126 (e.g., a hard storage device or a solid state drive (SSD)) according to embodiments of the present disclosure performs one or more lossy data compression schemes 120 after receiving raw, uncompressed data/a raw data file 128 from the host/host computer/host CPU 122, and compressing 123 the raw data file 128 to generate a compressed data file 124, which is then stored/saved 125 on the drive 126.

According to the present embodiment, a user may instruct the host 122 (e.g., by instructing the CPU to set a "request to compress" flag) to compress 123 raw data 128 (e.g., when the user has completed editing a video or audio data file to be saved 125 in a compressed form on the drive 126), to thereby cause the drive 126 to automatically compress 123 the raw data file 128 using lossy data compression to generate a compressed data file 124 on the drive 126 without use of the resources of the host 122. The intelligent, lossy data compression dive 126 allows for automated data compression by analyzing data (e.g., by analyzing the type of data file, available data compression methods and algorithms, user parameters, and quality of service (QoS) requirements, etc., as will be described further below), to identify cases where lossy data compression 123 is suitable. Thereafter, the drive 126 may perform lossy data compression 123 according to a selected data compression scheme, and may save 125 the compressed data file 124 thereon. It should be noted that the drive 126 may compress 123 the data 128 upon receiving it, or may store the data in an uncompressed format for some amount of time before compressing 123 the data and storing 125 the compressed data 124 thereon.

Figure 2:
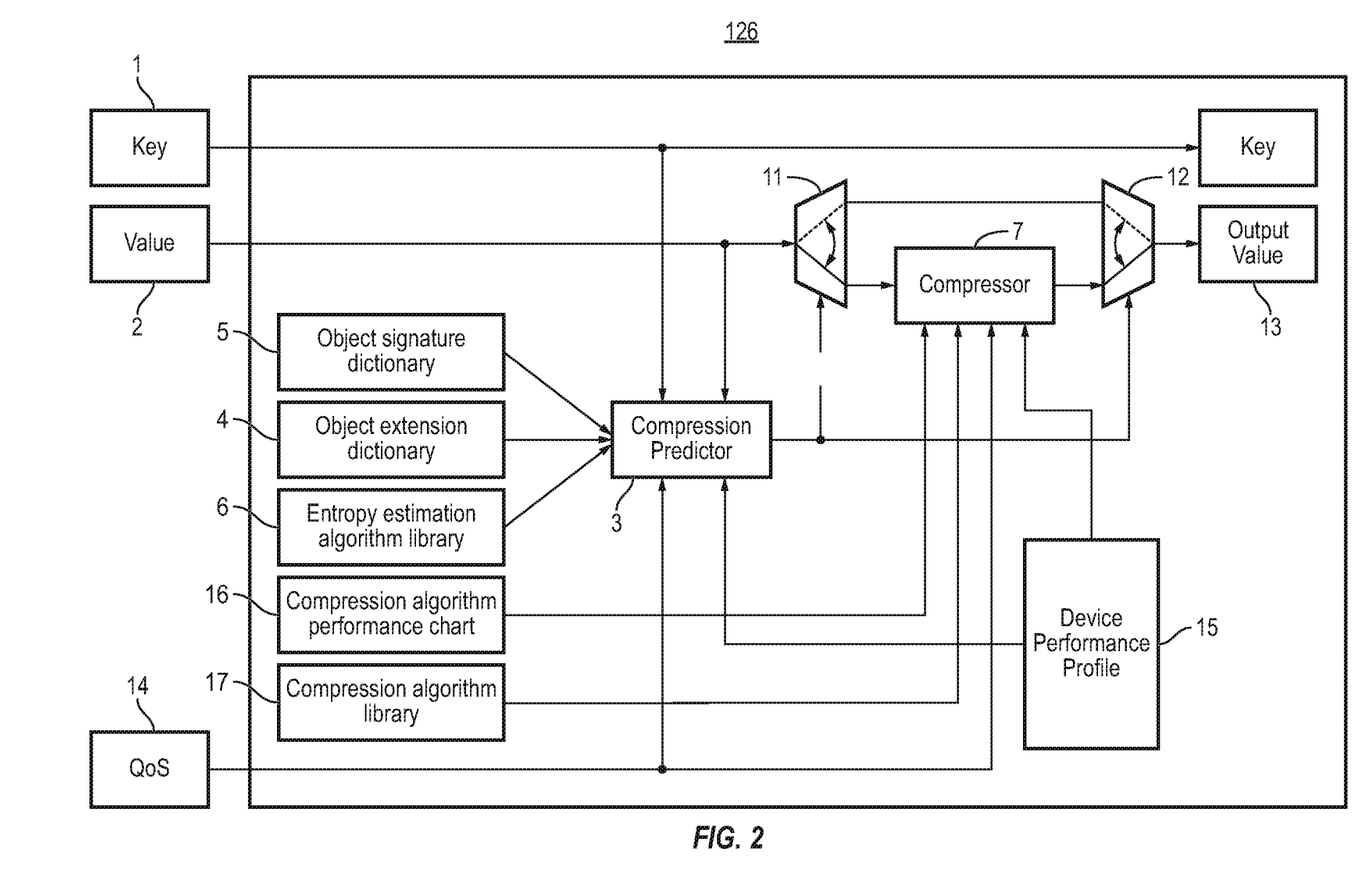
FIG. 2 depicts a lossy compression drive capable of performing intelligent lossy data compression at the drive without the aid of a host, according to an embodiment of the present disclosure.

FIG. 2 depicts a lossy compression drive capable of performing intelligent lossy data compression at the drive without the aid of a host, according to an embodiment of the present disclosure.

Referring to FIG. 2, as described above, a user may send the raw data file 128 (e.g., the raw sound data file in PCM format) from the host 122 directly to the drive 126. Thereafter, the drive 126 is able to identify the raw data file 128 as a raw data file that may be suitably converted into a lossy, compressed data file 124. Thereafter, the drive 126 may perform lossy data compression 123 to create the compressed data file 124 (e.g., the MP3 data file) within the drive 126, thereby converting the raw data file 128 into a compressed lossy data file 124, and thereafter storing/saving 125 the compressed lossy data file 124 on itself 126. Accordingly, the present embodiment is a storage device (e.g., a drive) 126 capable of performing well-controlled, lossy data compression 123 either automatically or semi-automatically, thereby freeing up CPU clock cycles and resources, which would otherwise be used by the host 122 to perform the data compression 113, for other activities.

The "smart compress" drive 126 may include a command and control protocol for data management, and relatively enhanced on-disk (e.g., on-SSD) resources. For example, unlike a conventional hard disk, the drive 126 may include a data compression algorithm library 17 that includes a variety of lossy data compression mechanisms. The on-board encoding library/data compression algorithm library 17 may contain code corresponding to various data compression algorithms for performing various lossy data compression schemes and encoding schemes. The drive 126 may also include a quality of service (QoS) preferences data file 14 that is expanded to include lossy data compression parameters. These parameters may be used by the drive 126 to determine how the raw data 128 is compressed.

Each lossy data compression request from the user is ultimately associated with the raw data file 128 to be compressed 123. The data compression request may contain a direct command that explicitly indicates the format of the file that should be the result of the compression 123, or that explicitly indicates parameters for guiding the drive 126 in performing the compression 123. Alternatively, the data compression request may correspond to an embedded command contained in key-metadata, and the drive 126 may determine how to perform the compression 123 based on the key-metadata.

For the drive 126 to compress 123 something in a lossy manner, the drive 126 may use information, such as a requested data compression algorithm or a final format, to determine what compression scheme to use (e.g., which data compression algorithm to select from the data compression algorithm library 17). That is, the drive 126 may use various information to enable it to understand that the drive 126 should compress the raw data file 128 using a certain lossy data compression algorithm, or that the drive 126 should ultimately save the compressed data file 124 in accordance with a particular lossy storage format (e.g., an MP3 data file, a JPEG data file, an MPEG data file, etc.).

Alternatively, the drive 126 may use parameters and settings (e.g., stored in a QoS preferences data file 14) to determine when and how to lossily compress data. For example, a QoS file may indicate that all files of a certain extension be compressed 123 into a JPEG data file. The QoS file may further contain compression specifics for compression algorithms, for example, allowing the user can select or tune a particular data compression scheme or quality setting, set a sub-sampling amount, or control a variety of other parameters.

Accordingly, the drive 126 may use information to understand the data compression format and the associated parameters required for any given raw data file received. According to embodiments of the present disclosure, the data compression format and parameters can be delivered and determined in one or more of at least three different options, to enable the drive 126 to learn this information, as will be described further below.

As another example of enhanced features of the drive 126, the drive 126 can include encoding acceleration hardware, and may be capable of performing data deduplication (dedupe) inline or offline and also capable of lossless data compression either online or offline. When the lossy data compression 123 is performed in online operation, the data is compressed 123 when, or nearly/substantially when, the raw data file 128 is received by the drive 126. When the lossy data compression 123 is performed in an offline mode, the uncompressed data 128 may be stored for an indeterminate amount of time on the drive 126. Then, when the drive 126 determines that it has sufficient time/resources, or when the drive 126 decides to work with the uncompressed data 128 stored on the drive 126, the data file 128 may be compressed 123 and re-saved 125 to the drive 126 as a compressed data file 124. Whether the drive 126 decides to operate online or offline may depend on estimations by the drive 126 corresponding to an estimated amount of available time and/or system resources needed for compressing.

Such estimations may be based on machine learning predictions, and may be determined based on analysis of an onboard device performance profile 15 of the drive 126. For example, the device performance profile 15 may include information corresponding to a record of ongoing physical capability of the 126 (e.g., free memory, processor ability, etc.), and a compression algorithm performance chart 16 may be used to predict an amount of free resources that may be required by a given task. Based on the information contained in the device performance profile 15 and the compression algorithm performance chart 16, the drive 126 may determine which compression algorithm from the data compression algorithm library 17 would most effectively make use of the available device resources based on a determination of the type of raw data file 128 to be compressed.

The compression algorithm performance chart 16 may contain information about a plurality of compression algorithms (e.g., average compression ratios for each compression algorithm, throughputs for each compression algorithm, computing and memory resource requirements for each compression algorithm, etc.), and may allow selection of a particular data compression algorithm from the data compression algorithm library 17 based on the file type, and the available throughput (which may be determined by the QoS needs from the QoS preferences data file 14), and the device capabilities based on the device performance profile 15.

Other enhanced features of the drive 126 may include an entropy estimation algorithm library 6, an object signature dictionary 5, and/or an object extension dictionary 4, which are able to recognize different types of raw media data files (e.g., by recognizing extensions or signatures of the raw data files).

The entropy estimation algorithm library 6, which may contain code for testing the entropy of any sampled data to thereby determine a level of compressibility of the data file 128. Entropy-based calculations may be used to search portions of the value 2 to predict the extent to which the file is compressible. Entropy-based calculations function on the principle that entropic or random data is harder to compress (e.g., files that have already been compressed have higher entropic characteristics, and an uncompressed file is more likely to have ordered data that is more compressible). The object signature dictionary 5 may contain known object/file signatures, which may correspond to respective compression techniques. The object extension dictionary 4 may contain a list of known object/file extensions with an evaluation of how compressible those types of objects are for each of a variety of compression techniques. This information is provided by the object extension dictionary 4 to a data compression predictor 3 to facilitate compression. Accordingly, the object extension dictionary 4 and the object signature dictionary 5 may provide information to a data compression predictor to facilitate compression (in part by detecting files that are already lossily compressed, and not re-compressing them).

Accordingly, when the raw data file 128 is received, various components of the drive 126 can be used to identify the type of raw data 128 to be compressed, which can be used to influence operation of the data compression predictor 3 and a compressor 7, which can then be used to select an appropriate data compression algorithm from the data compression algorithm library 17. For example, the data compression predictor 3 may use information contained in the object extension dictionary 4, the object signature dictionary 5, and/or an entropy estimation algorithm library 6 to determine or aid in determining the compressibility of the value 2.

Thereafter, the compressor 7 may perform the data compression based on the parameters indicated. The data compression predictor 3 and the compressor 7 may identify a data file, recognize what type of data file it is, and intelligently apply the most efficient lossy data compression algorithm based on factors such as immediate user demands, instantaneous performance of the drive 126, the QoS demands according to the QoS preferences data file 14 (which may be used to determine what data compression scheme should be used to compress the data), historical data compression algorithm performance stored in the compression algorithm performance chart 16, etc. The data compression predictor 3 and the compressor 7 may also later determine the existence of a better data compression algorithm that is available (e.g., if more processor space becomes available, more buffer space becomes available, etc.).

Once a determination is made by the data compression predictor 3 as to how to compress the raw data file 128, information is provided to a receiving switch 11, which then switches between outputting the data (e.g., the value 2) to the compressor 7, or bypassing the compressor 7 (if a decision is made not to compress, such as when a file type not identified as needing lossy compression is received) by sending the data to an exit switch 12 for output 13. Therefore, the data compression predictor 3 determines how compression should occur, and the receiving switch 11 will send data either to the compressor or to the exit switch 12 for output 13.

Below are presented three options for determining appropriate compression schemes and parameters for compressing 123 the raw data file 128 received by the drive 126.

As a first option, the data compression format and parameters can be determined as an explicit part of an enhanced save command.

In a conventional system, each raw data file 128 that is saved to the drive 126 may include an ultimate save order to the drive 126, thereby indicating an explicit directive to the drive 126 to save a certain raw data file 128 with a certain data compression type and with certain data compression parameters.

Contrastingly, with the present option, the data compression format and parameters may be determined explicitly as part of a save command when the user instructs the host 122 to command that the drive 126 save the raw data file 128 as a compressed data file 124. Of the three options presented herein, this option may generally be used with block-based storage devices (as block-based storage devices don't have a key-value metadata option, in accordance with a second option described below). However, implementation of this first option may require changes to the driver/OS layer of a traditional block-based data file system.

Changes to the driver/OS layer may include scanning all user activities resulting in a write command to the drive 126 to determine the existence of an intention or opportunity to lossily compress 123 a raw data file 128 (e.g., the user intentionally saving a bitmap as a JPEG, or moving a bitmap from an uncompressed drive onto the drive 126). Another change to the driver/OS layer may include interrupting a data compression request to confirm the user's intent, and to prompt the user to provide information regarding the parameters of the compression 123 (e.g., the user may interact with a menu at the host 122 that enables the user to select the parameters regarding the lossy data compression 123). Furthermore, additional modified commands may be used to transmit identity and parameter information, and to enable the drive 126 to identify which logical block addresses (LBAs) are associated with a target data file.

After obtaining information associated with one or more of the suggested changes to the driver/OS layer, the raw data file 128 may be sent to the drive 126, and the operating system and the driver may relay the information selected by the user from the host 122 to the drive 126. The present option may further implement certain enhanced protocols of communication with the drive 126.

As a second option, the data compression format and associated parameters can be explicitly encoded in a key 1 of a key 1 and value 2 ((KV) pair). the drive 126 may respond to an enhanced command or command set, or may detect an enriched key 1 associated with the raw data file 128, wherein writes of loss-compressible data are accompanied by a "request to compress" flag, data compression format identification, and/or data compression format parameters.

In a KV-based system in accordance with the present option, relevant information of the data compression format and parameters can be stored in a metadata portion of the key 1 indicating how the data should be stored. For example, the key 1 may have metadata indicating that the compressed data file 124 should be stored as a JPEG data file with a certain data compression setting and with a certain subsampling amount. For example, the data compression predictor 3 and the compressor 7 of the drive 126 may use information (e.g., metadata) contained in the key 1 to determine if the data file 128 should be modified/compressed and how the data compression should be performed.

Furthermore, the key 1 may contain a file/object extension that indicates the type of the data file 128, which may provide information regarding if/how compression is to be performed. A list of known object extensions may be maintained in the object extension dictionary 4, and information from the object extension dictionary 4 may be used by the data compression predictor 3 to determine the type of data compression 123.

The key 1 may also contain a file/object signature, which is a line of code that provides information regarding the type of data file 128 that is stored in the value 2 of the KV pair. A list of known signatures for data types may be maintained in the object signature dictionary 5, and information from the object signature dictionary 5 may be provided to the data compression predictor 3 to determine a type of compression 123 to use.

Accordingly, a key 1 may be received by the drive 126 to indicate that the received data is a raw media data file, and the key 1 may contain parameters of how the data compression should be done. Accordingly, the object signature dictionary 5 or the object extension dictionary 4 may detect, by reading the information/metadata of the key 1, that the received raw data file 128 corresponding to the value 2 should be compressed, and may use the metadata to determine which data compression algorithm should be used from the data compression algorithm library 17.

The drive 126 may read the metadata portion of the key 1 to determine how to compress 123 the data. When the data file 128 is sent as a KV object to the KV store, the KV store may read the key 1, may recognize and read the metadata portion, and may determine that the drive 126 is instructed to save 125 the compressed data file 124 with the selected type of lossy data compression 123 by using the indicated data compression format and parameters. By using the information contained in the metadata portion, the drive 126 can compress 123 the associated raw data file 128 with a designated data compression algorithm and parameters.

Accordingly, the data compression format and parameters can be an explicit part of a KV storage system. The key 1 of the KV pair can contain a metadata portion including hidden information, in which the parameters can be encoded to enable identification of the compressible data by the drive 126. User-level entry of such metadata information may be accomplished with a KV storage software stack. That is, the user may tag which data files 128 are sought to be lossily compressed 123, the information corresponding to the tag being included in the key 1 of the KV pair.

The present option provides a "fine-grained" control to the user, is easy to implement, and may be implemented with very minor changes. In accordance with this option, the user may understand that when a certain type of raw data file is saved to the drive 126, the data will be compressed.

As a third option, the data compression format and parameters can be done implicitly as part of a larger Quality of Service (QoS) preferences data file 14. The QoS preferences data file 14 may be generated (e.g., by the user) and established with the drive 126 to specify exact or general lossy compression and storage options. The QoS preferences data file 14 may contain settings for specific and/or global implementation of data compression policies (e.g., to indicate a default data compression type and parameters to be applied to all data files 128 of a given type, to require a backup copy of the raw data file 128 to be preserved, to prohibit or delay lossy data compression 123 under given situations, etc.).

The QoS preferences data file 14 may contain information that the drive 126 uses to identify objects raw data files 128 (e.g., information in a key 1, data file extensions, header signatures, etc.). Upon recognition by the drive 126 of a media data file that fits the QoS preferences data file 14, the options contained in the QoS preferences data file 14 may be implemented automatically by the intelligent drive 126. The drive 126 may use the information in the QoS preferences data file 14 to select and automatically apply an appropriate data compression algorithm and parameters. In some embodiments, global QoS demands may override or delay conflicting user instructions or key-field designations.

Accordingly, the drive 126 may be configured such that when the user causes the host 122 to send to the drive 126 a particular type of raw data file 128, the drive 126 may compress 123 and save 125 the data in a corresponding way according to the QoS preferences data file 14. This option theoretically provides less control to the user after the initial configuration of the general rules, which can be applied on thousands of data files 128, thereby removing some amount of fine control from the user. However, this option allows for global data compression control, such that the QoS preferences data file 14 may allow for global configuration of data compression mechanisms, and may reduce intrusive user interactions. It should be noted that a drive 126 according to the present embodiment may include additional hardware resources, such as one or more of a faster controller processor, larger write buffers, larger controller processor RAM allocation, and/or a data compression/encoding accelerator.

Accordingly, the above described embodiments provide a self-sufficient storage device capable of intelligent lossy data compression.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A method for lossy data compression, the method comprising:
    receiving raw data at a storage device;
    receiving a request to compress;
    accessing a data compression algorithm library containing data compression algorithms respectively corresponding to lossy data compression schemes;
    selecting one of the data compression algorithms based on metadata associated with a key of a key-value pair corresponding to the raw data; and
    running the selected data compression algorithm,
    wherein the storage device is configured to perform the data compression algorithms according to a first mode wherein the selected data compression algorithm is performed online such that received raw data is compressed by the storage device, and is stored on the storage device as compressed data, or a second mode wherein the selected data compression algorithm is performed offline such that the raw data is stored at the storage device, is compressed by the storage device according to the selected data compression algorithm, and is resaved at the storage device as compressed data.

2. The method of claim 1, further comprising prompting a user requesting to compress the raw data to provide the metadata.

3. The method of claim 1, further comprising:
    reading the metadata, which is associated with the raw data corresponding to an object signature or an object extension;
    accessing an object signature dictionary on the storage device or an object extension dictionary on the storage device to determine a data type of the raw data based on the object signature or the object extension, respectively; and
    selecting the data compression algorithm based on the determined data type.

4. A method of data compression, the method comprising:
    receiving raw data at a storage device;
    compressing the raw data according to a lossy data compression scheme, with the storage device, to generate compressed data;
    storing the compressed data on the storage device;
    reading metadata of a key of a key-value pair corresponding to the raw data;
    selecting a data compression algorithm from a data compression algorithm library on the storage device according to the metadata; and
    performing a data compression scheme for compressing the raw data in accordance with the selected data compression algorithm.

5. The method of claim 4, further comprising determining, with the storage device, the data compression scheme for compressing the raw data.

6. The method of claim 5, further comprising:
    establishing a quality of service (QoS) preferences data file containing information regarding compression schemes and parameters;
    identifying, by the storage device, an object file corresponding to the raw data; and
    determining the data compression scheme for compressing the raw data according to the information and the object file.

7. The method of claim 4, wherein the raw data comprises an object signature or an object extension, the method further comprising:
    accessing an object signature dictionary on the storage device or an object extension dictionary on the storage device to determine a data type of the raw data based on the object signature or the object extension, respectively; and performing the data compression scheme based on the determined data type.

8. The method of claim 4, further comprising sending the raw data from a host computer to the storage device in accordance with a user request.

9. The method of claim 8, further comprising:
providing a menu to prompt the user to provide information; and
determining a data compression algorithm for compressing the raw data according to the user-provided information.

10. The method of claim 4, further comprising storing the raw data on the storage device;
estimating available time or resources corresponding to the storage device; and
compressing the raw data upon determining that sufficient time and resources are available.

11. A data compression system comprising:
a host; and
a storage device configured to receive raw data from the host, and comprising:
a memory; and
a processor configured to execute instructions that, when executed by the processor, cause the processor to:
cause the storage device to compress the raw data according to a lossy data compression scheme to generate compressed data;
cause the storage device store the compressed data on the storage device;
read metadata of a key of a key-value pair corresponding to the raw data;
select a data compression algorithm from a data compression algorithm library according to the metadata; and
perform the data compression scheme for compressing the raw data in accordance with the selected data compression algorithm.

12. The system of claim 11, wherein the instructions, when executed by the processor, further cause the processor to cause the storage device to determine the data compression scheme for compressing the raw data.

13. The system of claim 12, wherein the instructions, when executed by the processor, further cause the processor to cause the storage device to:
access a quality of service (QoS) preferences data file containing information regarding compression schemes and parameters;
identify an object file corresponding to the raw data; and
determine the data compression scheme for compressing the raw data according to the information and the object file.

14. The system of claim 12, wherein the raw data comprises an object signature or an object extension, and
wherein the instructions, when executed by the processor, further cause the processor to cause the storage device to:
access an object signature dictionary on the storage device or an object extension dictionary on the storage device to determine a data type of the raw data based on the object signature or the object extension, respectively; and
perform the data compression scheme based on the determined data type.

15. The system of claim 11, wherein the instructions, when executed by the processor, further cause the processor to cause the storage device to receive the raw data from a host computer in accordance with a user request.

16. The system of claim 15, wherein the instructions, when executed by the processor, further cause the processor to:
cause the host to provide a menu to prompt a user, who is requesting the raw data to be compressed, to provide information; and
cause the storage device to determine a data compression algorithm for compressing the raw data according to the user-provided information.

17. The system of claim 11, wherein the instructions, when executed by the processor, further cause the processor to cause the storage device to:
store the raw data on the storage device;
estimate available time or resources corresponding to the storage device; and
when sufficient time and resources are available, compress the raw data.

* * * * *